United States Patent
Lee et al.

(10) Patent No.: US 10,756,175 B2
(45) Date of Patent: Aug. 25, 2020

(54) INNER SPACER FORMATION AND CONTACT RESISTANCE REDUCTION IN NANOSHEET TRANSISTORS

(71) Applicant: International Business Machines Corporation, Armonk, NY (US)

(72) Inventors: Choonghyun Lee, Rensselaer, NY (US); Kangguo Cheng, Schenectady, NY (US); Juntao Li, Cohoes, NY (US); Shogo Mochizuki, Clifton Park, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 52 days.

(21) Appl. No.: 16/134,203

(22) Filed: Sep. 18, 2018

(65) Prior Publication Data

US 2020/0091288 A1    Mar. 19, 2020

(51) Int. Cl.

| | |
|---|---|
| *H01L 21/00* | (2006.01) |
| *H01L 29/06* | (2006.01) |
| *H01L 29/78* | (2006.01) |
| *H01L 29/08* | (2006.01) |
| *H01L 29/10* | (2006.01) |
| *H01L 29/66* | (2006.01) |
| *H01L 29/161* | (2006.01) |

(Continued)

(52) U.S. Cl.
CPC .......... *H01L 29/0673* (2013.01); *H01L 21/56* (2013.01); *H01L 21/823864* (2013.01); *H01L 29/0847* (2013.01); *H01L 29/1033* (2013.01); *H01L 29/161* (2013.01); *H01L 29/6656* (2013.01); *H01L 29/6681* (2013.01); *H01L 29/66545* (2013.01); *H01L 29/66553* (2013.01); *H01L 29/7851* (2013.01); *H01L 2029/7858* (2013.01)

(58) Field of Classification Search
CPC .......... H01L 29/0673; H01L 29/66553; H01L 29/1033
See application file for complete search history.

(56) References Cited

U.S. PATENT DOCUMENTS

| | | |
|---|---|---|
| 9,324,801 B2 | 4/2016 | Lauer et al. |
| 9,583,491 B2 | 2/2017 | Kim et al. |
| (Continued) | | |

OTHER PUBLICATIONS

Bansal et al., "Series Resistance Reduction in Stacked Nanowire FETs for 7-nm CMOS Technology," Journal of the Electron Devices Society, vol. 4, No. 5, Sep. 2016, pp. 266-272.

(Continued)

*Primary Examiner* — Laura M Menz
(74) *Attorney, Agent, or Firm* — Cantor Colburn LLP; Vazken Alexanian

(57) ABSTRACT

A nanosheet field effect transistor device includes a semiconductor substrate including a stack of semiconductor nanosheets and a gate structure. The gate structure has an electrically conductive gate contact on the nanosheets and defines a channel region interposed between opposing source or drain (S/D) regions. The nanosheet field effect transistor further includes an electrically conductive cladding layer that encapsulates an outer surface of the S/D regions, and inner spacers on the sidewalls of the gate structure. The inner spacers are interposed between the cladding layer and the gate contact.

7 Claims, 17 Drawing Sheets

(51) Int. Cl.
*H01L 21/56* (2006.01)
*H01L 21/8238* (2006.01)

(56) References Cited

U.S. PATENT DOCUMENTS

| | | | |
|---|---|---|---|
| 9,842,777 B2 | 12/2017 | Witters et al. | |
| 9,893,161 B2 | 2/2018 | Nakamura et al. | |
| 10,243,060 B2* | 3/2019 | Chao | H01L 29/66553 |
| 10,332,962 B2* | 6/2019 | Miao | H01L 29/1033 |
| 10,403,738 B1* | 9/2019 | Sung | H01L 21/0217 |
| 10,446,664 B1* | 10/2019 | Cheng | H01L 29/0673 |
| 10,553,679 B2* | 2/2020 | Zhang | H01L 21/2236 |
| 10,615,258 B2* | 4/2020 | Miao | H01L 21/02587 |
| 2013/0341596 A1 | 12/2013 | Chang et al. | |
| 2016/0204263 A1 | 7/2016 | Mukherjee et al. | |
| 2017/0154958 A1 | 6/2017 | Fung et al. | |
| 2017/0207313 A1 | 7/2017 | Song et al. | |
| 2017/0345915 A1 | 11/2017 | Coquand et al. | |
| 2018/0069000 A1* | 3/2018 | Bergendahl | H01L 27/0886 |
| 2018/0114727 A1 | 4/2018 | Rodder et al. | |
| 2018/0277656 A1* | 9/2018 | Chao | H01L 21/02255 |
| 2019/0109191 A1* | 4/2019 | Miao | H01L 29/0653 |
| 2019/0181224 A1* | 6/2019 | Zhang | H01L 21/02532 |
| 2019/0189741 A1* | 6/2019 | Miao | H01L 29/66469 |
| 2019/0296127 A1* | 9/2019 | Cheng | B82Y 10/00 |
| 2019/0393306 A1* | 12/2019 | Zhang | H01L 21/28518 |
| 2019/0393345 A1* | 12/2019 | Cheng | H01L 29/1037 |
| 2020/0006577 A1* | 1/2020 | Ching | H01L 29/0673 |
| 2020/0020768 A1* | 1/2020 | Lee | H01L 21/823814 |
| 2020/0052132 A1* | 2/2020 | Ching | H01L 29/6653 |
| 2020/0066712 A1* | 2/2020 | Hafez | H01L 29/785 |
| 2020/0083222 A1* | 3/2020 | Kim | H01L 29/785 |
| 2020/0091288 A1* | 3/2020 | Lee | H01L 29/6656 |

OTHER PUBLICATIONS

Chung et al., "Vertically Stacked Cantilever n-Type Poly-Si Junctionless Nanowire Transistor and Its Series Resistance Limit," IEEE Transactions on Electron Devices, vol. 65, No. 2, Feb. 2018, pp. 756-762.

* cited by examiner

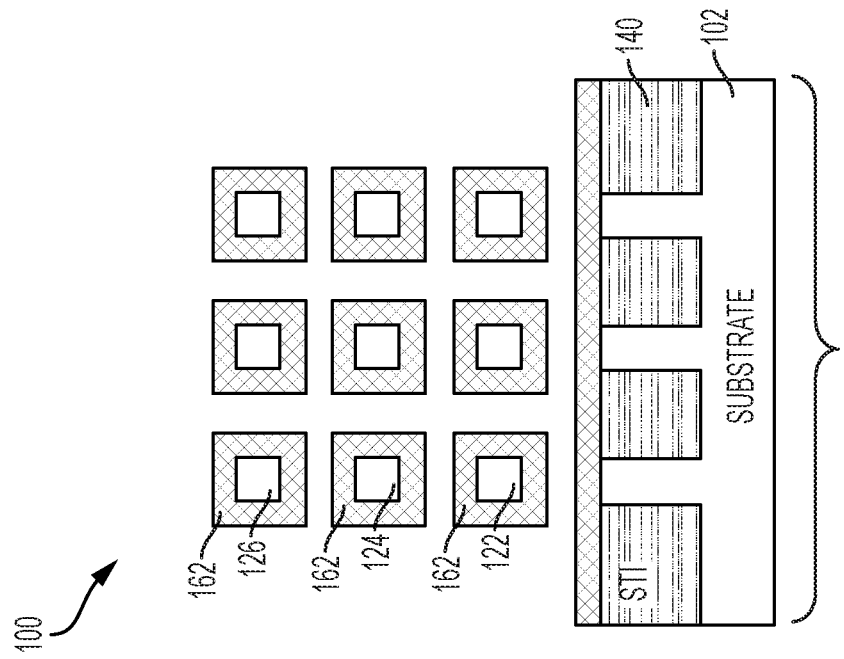
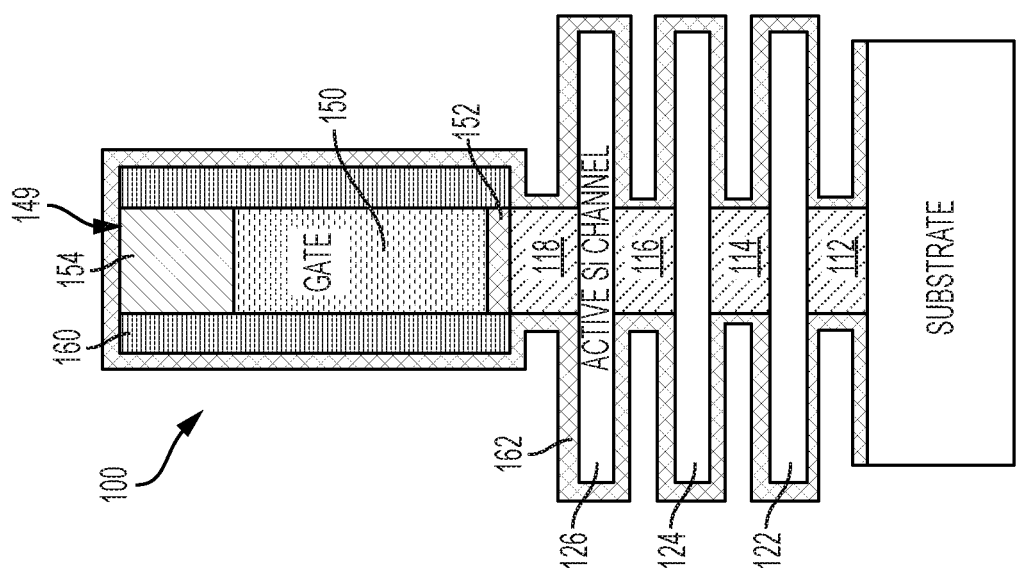
FIG. 3A
FIG. 3B

US 10,756,175 B2

INNER SPACER FORMATION AND CONTACT RESISTANCE REDUCTION IN NANOSHEET TRANSISTORS

BACKGROUND

The present invention relates in general to fabrication methods and resulting structures for semiconductor devices. More specifically, the present invention relates to fabrication methods and resulting structures for forming inner spacers and reducing contact resistance in vertically stacked nanosheet transistors.

In contemporary semiconductor device fabrication processes, a large number of semiconductor devices, such as silicon channel n-type field effect transistors (nFETs) and silicon germanium channel p-type field effect transistors (pFETs), are fabricated on a single wafer. Non-planar transistor device architectures, such as nanosheet (or nanowire) transistors, can provide increased device density and increased performance over planar transistors. Nanosheet transistors, in contrast to conventional planar FETs, include a gate stack that wraps around the full perimeter of multiple nanosheet channel regions. Nanosheet transistor configurations enable fuller depletion in the nanosheet channel regions and reduce short-channel effects.

SUMMARY

Embodiments of the invention are directed to a method of fabricating a semiconductor device. A non-limiting example of the method includes performing fabrication operations to form a stack of alternating layers of sacrificial nanosheets and semiconductor nanosheets on a semiconductor substrate. The method further includes forming a gate structure on the stack to define a channel region of the semiconductor nanosheets. The channel region is interposed between opposing source or drain (S/D) regions. The method further includes depositing a sacrificial layer comprising a first dielectric material on the S/D regions of the semiconductor nanosheets and sidewalls of the sacrificial nanosheets, and converting a portion of the sacrificial layer into a second dielectric material different form the first dielectric material to form inner spacers of the semiconductor device.

Embodiments of the invention are directed to a method of fabricating a semiconductor device. A non-limiting example of the method includes forming a stack of alternating layers of sacrificial nanosheets and semiconductor nanosheets on a semiconductor substrate, and forming a gate structure on the stack to define a channel region of the semiconductor nanosheets. The channel region is interposed between opposing source/drain (S/D) regions. The method further includes forming a first cladding layer comprising a first semiconductor material on an outer surface of the S/D regions, and forming a second cladding layer comprising a second semiconductor material on the first cladding layer to define a S/D contact profile. The method further includes removing the second cladding layer while preserving the first cladding layer to form S/D contact trenches. The method further includes filling the S/D contact trenches with an electrically conductive contact material to form the S/D contacts having the S/D contact profile.

Embodiments of the invention are further directed to a nanosheet field effect transistor device. A non-limiting example of the device includes a semiconductor substrate including a stack of semiconductor nanosheets and a gate structure including an electrically conductive gate contact on the nanosheets. The gate structure defines a channel region interposed between opposing source or drain (S/D) regions. The nanosheet field effect transistor further includes an electrically conductive cladding layer encapsulating an outer surface of the S/D regions, and inner spacers on the sidewalls of the gate structure. The inner spacers are interposed between the cladding layer and the gate contact.

Additional features and advantages are realized through techniques described herein. Other embodiments and aspects are described in detail herein. For a better understanding, refer to the description and to the drawings.

BRIEF DESCRIPTION OF THE DRAWINGS

The subject matter which is regarded as embodiments is particularly pointed out and distinctly claimed in the claims at the conclusion of the specification. The foregoing and other features and advantages of the embodiments are apparent from the following detailed description taken in conjunction with the accompanying drawings in which:

FIGS. 1A-14C depict cross-sectional views of a section of a substrate/wafer after various fabrication operations to form a nanosheet/nanowire transistor thereon according to embodiments of the present invention, in which:

FIG. 1A depicts a top view of a semiconductor structure after a fabrication stage according to embodiments of the present invention;

FIG. 2 depicts a cross-sectional view of a semiconductor structure after a fabrication stage according to embodiments of the present invention;

FIG. 3A depicts a cross-sectional view of a semiconductor structure after a fabrication stage according to embodiments of the present invention;

FIG. 3B depicts a cross-sectional view of the semiconductor structure shown in FIG. 3A, wherein the cross-sectional view is taken through a vertical plane extending through a S/D region of the semiconductor structure shown in FIG. 3A and rotated counterclockwise by 90 degrees;

FIG. 4 depicts a cross-sectional view of a semiconductor structure after a fabrication stage according to embodiments of the present invention;

FIG. 5 depicts a cross-sectional view of a semiconductor structure after a fabrication stage according to embodiments of the present invention;

FIG. 6 depicts a cross-sectional view of a semiconductor structure after a fabrication stage according to embodiments of the present invention;

FIG. 8 depicts a cross-sectional view of a semiconductor structure after a fabrication stage according to embodiments of the present invention;

FIG. 9 depicts a cross-sectional view of a semiconductor structure after a fabrication stage according to embodiments of the present invention; and FIG. 10 depicts a cross-sectional view of a semiconductor structure after a fabrication stage according to embodiments of the present invention;

FIG. 11 depicts a cross-sectional view of a semiconductor structure after a fabrication stage according to embodiments of the present invention;

FIG. 12 depicts a cross-sectional view of a semiconductor structure after a fabrication stage according to embodiments of the present invention;

FIG. 13 depicts a cross-sectional view of a semiconductor structure after a fabrication stage according to embodiments of the present invention;

FIG. 14C depicts a cross-sectional view of the semiconductor structure shown in FIG. 14A, wherein the cross-sectional view is taken through a vertical plane extending through a S/D region of the semiconductor structure shown in FIG. 14A and rotated counterclockwise by 90 degrees.

DETAILED DESCRIPTION

Figure 1A:
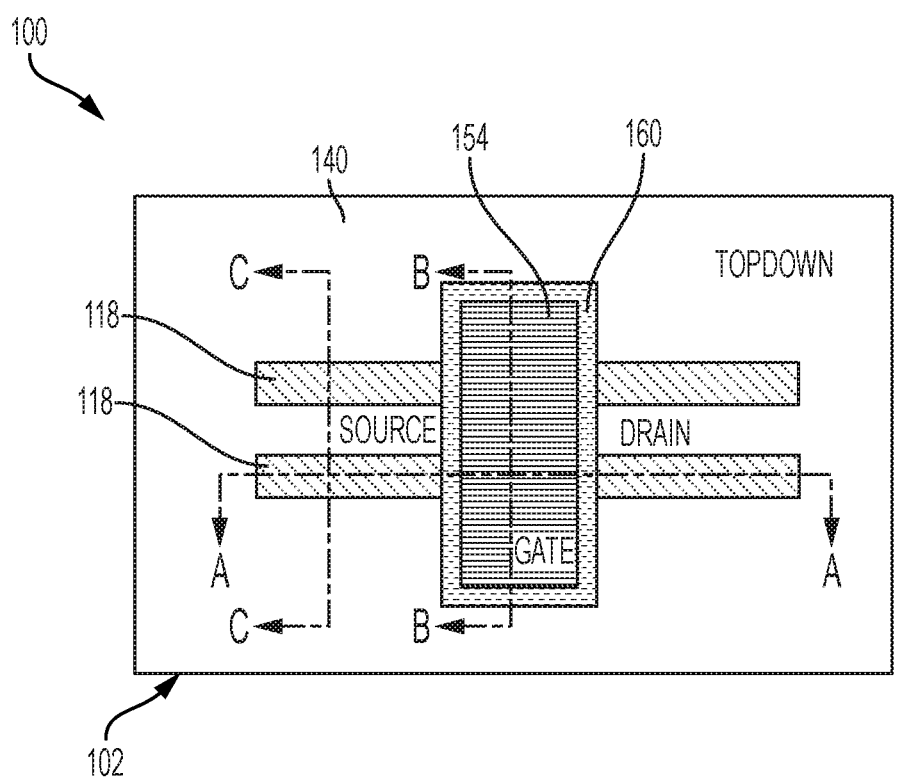

It is understood in advance that although this invention includes a detailed description of exemplary gate all-around (GAA) nanosheet FET architectures having silicon (Si) channel nanosheets and silicon germanium (SiGe) sacrificial nanosheets, embodiments of the invention are not limited to the particular FET architectures or materials described in this specification. Rather, embodiments of the present invention are capable of being implemented in conjunction with any other type of nanosheet/nanowire FET architecture or materials now known or later developed. In this detailed description and in the claims, the terms nanosheet and nanowire are treated as being synonymous.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to a description of technologies that are more specifically relevant to the present invention, transistors are semiconductor devices commonly found in a wide variety of ICs. A transistor can serve as an electrical switch. When a voltage is applied to a gate of the transistor that is greater than a threshold voltage, the switch is turned on, and current flows through the transistor. When the voltage at the gate is less than the threshold voltage, the switch is off, and current does not flow through the transistor.

Typical semiconductor devices are formed using active regions of a wafer. The active regions are defined by isolation regions used to separate and electrically isolate adjacent semiconductor devices. For example, in an integrated circuit having a plurality of metal oxide semiconductor field effect transistors (MOSFETs), each MOSFET has a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer. Complementary metal oxide semiconductor (CMOS) is a technology that uses complementary and symmetrical pairs of p-type and n-type MOSFETs to implement logic functions. The channel region connects the source and the drain, and electrical current flows through the channel region from the source to the drain. The electrical current flow is induced in the channel region by a voltage applied at the gate electrode.

The wafer footprint of a FET is related to the electrical conductivity of the channel material. If the channel material has a relatively high conductivity, the FET can be made with a correspondingly smaller wafer footprint. A known method of increasing channel conductivity and decreasing FET size is to form the channel as a nanostructure. For example, a so-called gate-all-around (GAA) nanosheet FET is a known architecture for providing a relatively small FET footprint by forming the channel region as a series of nanosheets. In a known GAA configuration, a nanosheet-based FET includes a source region, a drain region and stacked nanosheet channels between the source and drain regions. A gate surrounds the stacked nanosheet channels and regulates electron flow through the nanosheet channels between the source and drain regions. GAA nanosheet FETs are fabricated by forming alternating layers of channel nanosheets and sacrificial nanosheets. The sacrificial nanosheets are released from the channel nanosheets before the FET device is finalized. For n-type FETs, the channel nanosheets are typically silicon (Si) and the sacrificial nanosheets are typically silicon germanium (SiGe). For p-type FETs, the channel nanosheets are typically SiGe and the sacrificial nanosheets are typically Si. In some implementations, the channel nanosheet of a p-FET can be SiGe or Si, and the sacrificial nanosheets can be Si or SiGe. Forming the GAA nanosheets from alternating layers of channel nanosheets formed from a first type of semiconductor material (e.g., Si for n-type FETs, and SiGe for p-type FETs) and sacrificial nanosheets formed from a second type of semiconductor material (e.g., SiGe for n-type FETs, and Si for p-type FETs) provides superior channel electrostatics control, which is necessary for continuously scaling CMOS technology down to seven (7) nanometer (nm) node and below. The use of multiple layered SiGe/Si sacrificial/channel nanosheets (or Si/SiGe sacrificial/channel nanosheets) to form the channel regions in GAA FET semiconductor devices provides desirable device characteristics, including the introduction of strain at the interface between SiGe and Si.

Although nanosheet channel FET architectures provide increased device density over planar FET architectures, there are still challenges when attempting to fabricate nanosheet channel FETs that provide the performance characteristics required for a particular application. For example, in known nanosheet FET fabrication processes, the elongated fin-shaped columns formed from alternating layers of Si channel nanosheets and SiGe sacrificial nanosheets are chopped into smaller fin-shaped columns in order to form inner spacers at the end regions of the SiGe sacrificial nanosheets.

The quality of an epitaxial growth is related to the surface area from which the epitaxial growth occurs. However, it can be difficult to form high quality epitaxially grown S/D regions using conventional nanosheet fabrication methods because known nanosheet fabrication processes leave only limited single crystalline surface areas available for epitaxially growing the S/D regions. For instance, conventional procedures typically used to form the inner spacers leaves only a limited cross-section surface at the ends of the chopped Si channel nanosheets from which to epitaxially grow the S/D regions. Consequently, not only is it difficult to epitaxially grow high quality S/D regions, access to the S/D epitaxy is typically limited to the epitaxy upper surface resulting in increased S/D contact resistance.

Turning now to an overview of aspects of the invention, embodiments of the invention provide fabrication methods and resulting structures for forming inner spacers and reducing contact resistance in vertically stacked nanosheet transistors. In embodiments of the invention, source/drain (S/D) regions and S/D contacts are formed using the entire circumference of the nanowire.

Figure 1B:
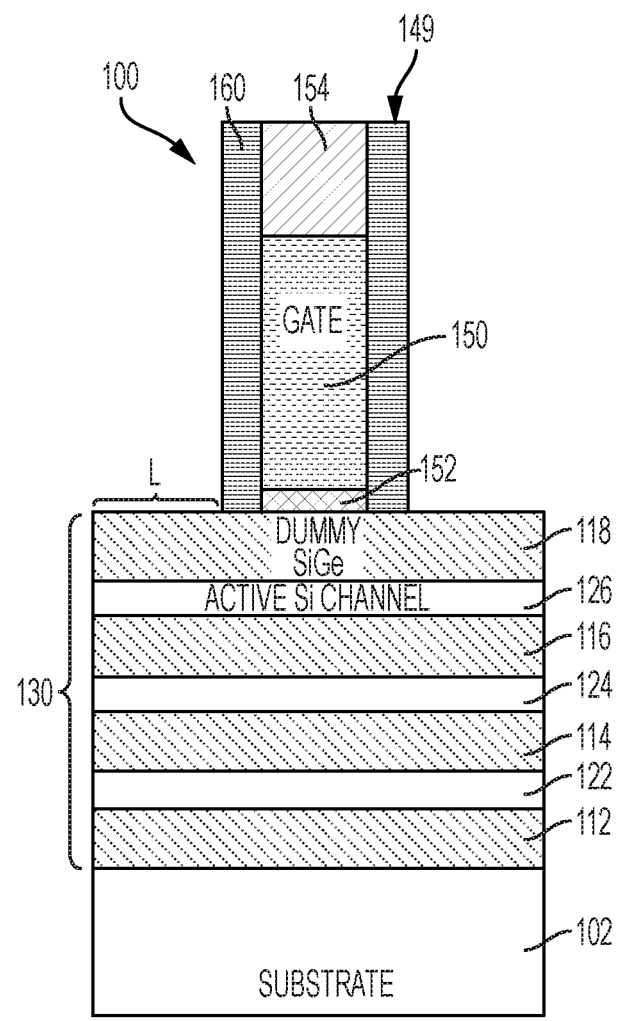
FIG. 1B is a second orientation of the semiconductor structure shown in FIG. 1A depicting a cross-sectional view taken along line A-A of the semiconductor structure shown in FIG. 1A after a fabrication stage according to embodiments of the present invention.
Figure 1C:
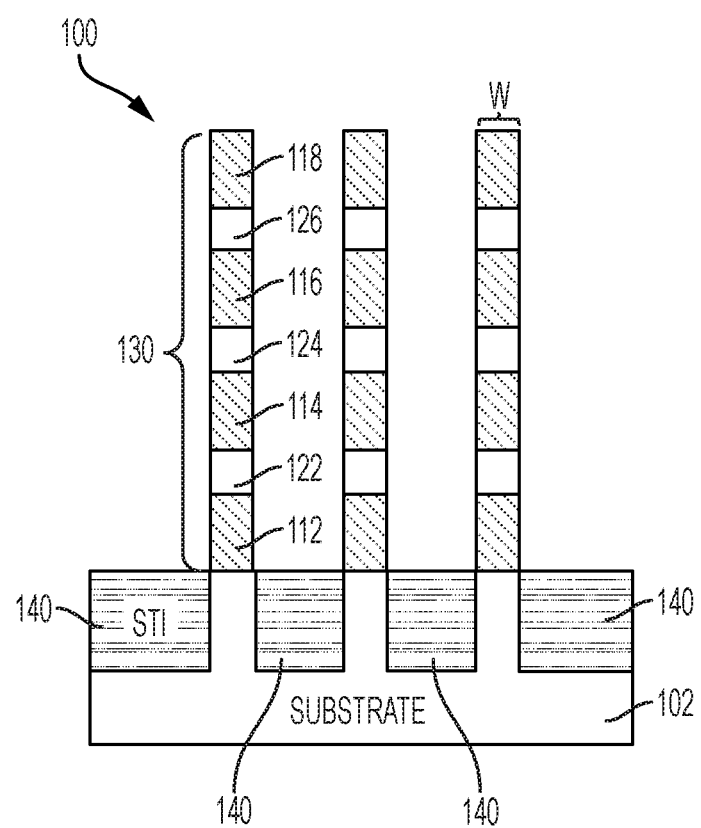
FIG. 1C is a fourth orientation of the semiconductor structure shown in FIG. 1A depicting a cross-sectional view taken through a vertical plane extending through a source/drain (S/D) region along line C-C shown and rotated counterclockwise by 90 degrees.

Turning now to a more detailed description of aspects of the invention, FIGS. 1A-14C depict cross-sectional views of a semiconductor structure 100 on a substrate/wafer 102 after various fabrication operations to form a nanosheet/nanowire transistor thereon according to embodiments of the present invention. FIG. 1B depicts a cross-sectional view (i.e., looking across the dummy gate 150 and through the fin 130) of the semiconductor structure 100 after an initial set of fabrication operations according to embodiments of the present invention. FIG. 1C depicts a cross-sectional view of the semiconductor structure 100 shown in FIG. 1A. The cross-sectional view (i.e., across the fins 130 and looking through the S/D region 204) is taken through a vertical plane extending through the S/D region 204 of the semiconductor structure 100 shown in FIG. 1A and rotated counterclockwise by 90 degrees.

The fabrication operations used to form the semiconductor structure 100 shown in FIG. 1B includes forming an alternating series of SiGe dummy/sacrificial nanosheet layers 112, 114, 116, 118 and Si active nanosheet layers 122, 124, 126 in a stack on the Si substrate 102. In some embodiments of the invention, the SiGe nanosheet layers 112, 114, 116, 118 can be SiGe 25%. The notation "SiGe 25%" is used to indicate that 25% of the SiGe material is Ge.

In embodiments of the invention, the alternating series of SiGe dummy/sacrificial nanosheet layers 112, 114, 116, 118 and Si active nanosheet layers 122, 124, 126 can be formed by epitaxially growing one layer and then the next until the desired number and desired thicknesses of the nanosheet layers are achieved. Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) can be doped during deposition (in-situ doped) by adding dopants, n-type dopants (e.g., phosphorus or arsenic) or p-type dopants (e.g., boron or gallium), depending on the type of transistor.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surfaces, and generally do not deposit material on exposed surfaces, such as silicon dioxide or silicon nitride surfaces.

In some embodiments, the gas source for the deposition of epitaxial semiconductor material include a silicon containing gas source, a germanium containing gas source, or a combination thereof. For example, an epitaxial silicon layer can be deposited from a silicon gas source that includes, but is not limited to, silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from a group that includes, but is not limited to, germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

As best shown in FIG. 1C, known semiconductor fabrication operations have been used to etch or recess the alternating nanosheet layers 112, 122, 114, 124, 116, 126, 118 to form multiple elongated fin-shaped columns 130. In an example fabrication process, a patterned hard mask (not shown) is deposited over the alternating nanosheet layers 112, 122, 114, 124, 116, 126, 118. The pattern of the hard mask defines the footprints of the multiple elongated columns 130. An etch (e.g., an RIE) or a recess can be applied to remove the portions of the alternating nanosheet layers that are not covered by the patterned hard mask, thereby forming the intermediate elongated columns 130 formed from alternating series of SiGe dummy/sacrificial nanosheet layers 112, 114, 116, 118 and Si active nanosheet layers 122, 124, 126.

As best shown in FIG. 1C, transistor isolation is provided by forming shallow trench isolation (STI) regions 140 between the elongated fin-shaped columns 130. In embodiments of the invention, the STI regions 140 can be formed by depositing bulk dielectric material between the elongated fin-shaped columns 130 and recessing the bulk dielectric to the desired level.

As best shown in FIGS. 1B and 1C, known semiconductor fabrication operations have been used to form a gate structure 149. The gate structure 149 includes a gate dielectric/oxide 152 and a dummy gate 150 that extend over and around each of the elongated fin-shaped columns 130. The gate oxide 152 and dummy gate 150 can serve as sacrificial elements, which can be removed at subsequent stages of the process flow described in greater detail below.

The dummy gate 150 can be formed by depositing amorphous silicon (a-Si) over and around the elongated fin-shaped columns 130. The a-Si is then planarized to a desired level. A hard mask layer (not shown) is deposited over the planarized a-Si and patterned to form a hard mask gate cap 154. In embodiments of the invention, the gate cap 154 can be formed from a nitride or an oxide layer. An etching process (e.g., an RIE) is applied to the a-Si to form the dummy gate 150.

As best shown in FIG. 1B, known semiconductor fabrication operations have been used to form offset gate spacers 160 along sidewalls of the dummy gate 160. The offset gate spacers 160 can be formed using a spacer pull down formation process. The offset gate spacers 160 can also be formed by a conformal deposition of a dielectric material (e.g., silicon oxide, silicon nitride, silicon oxynitride, SiBCN, SiOCN, SiOC, or any suitable combination of those materials) followed by a directional etch (e.g., RIE).

At the fabrication stage shown in FIGS. 1B and 1C the elongated fin-shaped columns 130 include exposed portions (outside the dummy gate 150 and offset gate spacers 160) having lateral sidewalls having a length (L) and end sidewalls having a width (W).

Figure 2:
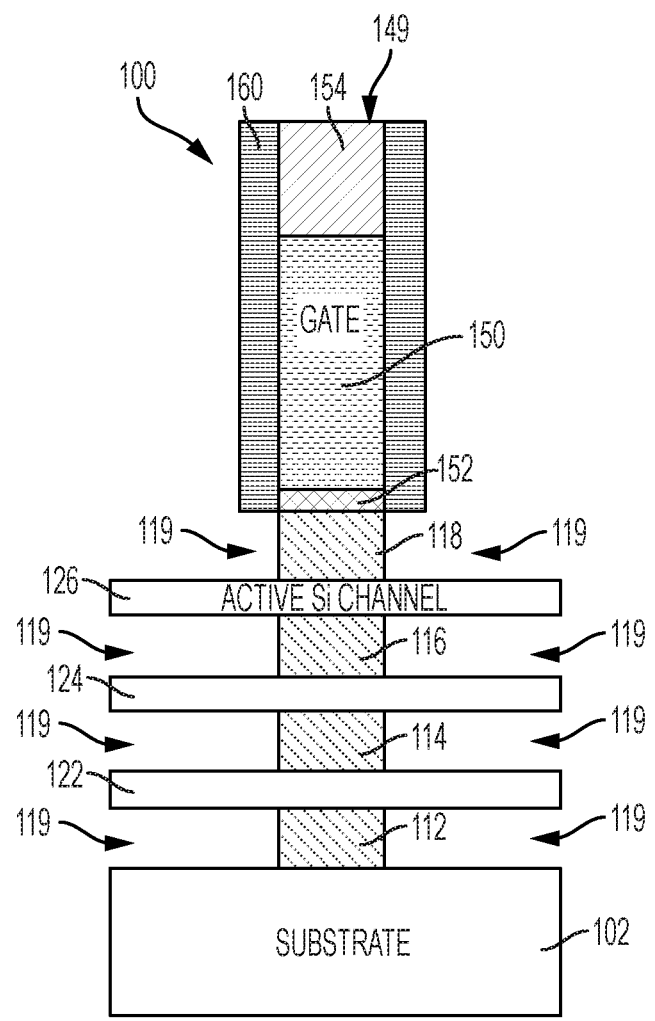

Referring to FIG. 2, known semiconductor device fabrication processes have been used to remove portions of the sacrificial nanosheets 112, 114, 116, 118. Removing portions of the sacrificial nanosheets 112, 114, 116, 118 forms recessed regions 119 in between the active nanosheet layers 122, 124, 126. In one or more embodiments of the invention, the sacrificial nanosheets 112, 114, 116, 118 are formed of SiGe and a lateral etch is employed to selectively etch back the SiGe nanosheets 112, 114, 116, 118 to form the recessed regions. Accordingly, S/D regions of the active nanosheet layers 122, 124, 126 are exposed. The lateral etch can include, for example, a RIE or wet etch. In some embodiments, the lateral etch removes equal portions of the sacrificial nanosheets 112, 114, 116, 118 so that remaining portions of the sacrificial nanosheets 112, 114, 116, 118 have a same width across the nanosheet stack 130.

Turning to FIGS. 3A and 3B, the semiconductor structure 100 is illustrated following deposition of a sacrificial film 162. The sacrificial film 162 conforms to the exposed surfaces the gate structure 149, the remaining portions of sacrificial nanosheets 112, 114, 116, 118, and the S/D regions of the active nanosheet layers 122, 124, 126. The sacrificial film 162 can be an oxide material such as germanium oxide ($GeO_2$), for example, and can be applied using an atomic layer deposition (ALD) process. The sacrificial film 162 can have a thickness ranging, for example, from about 3 nanometers (nm) to about 6 nm.

Figure 4:
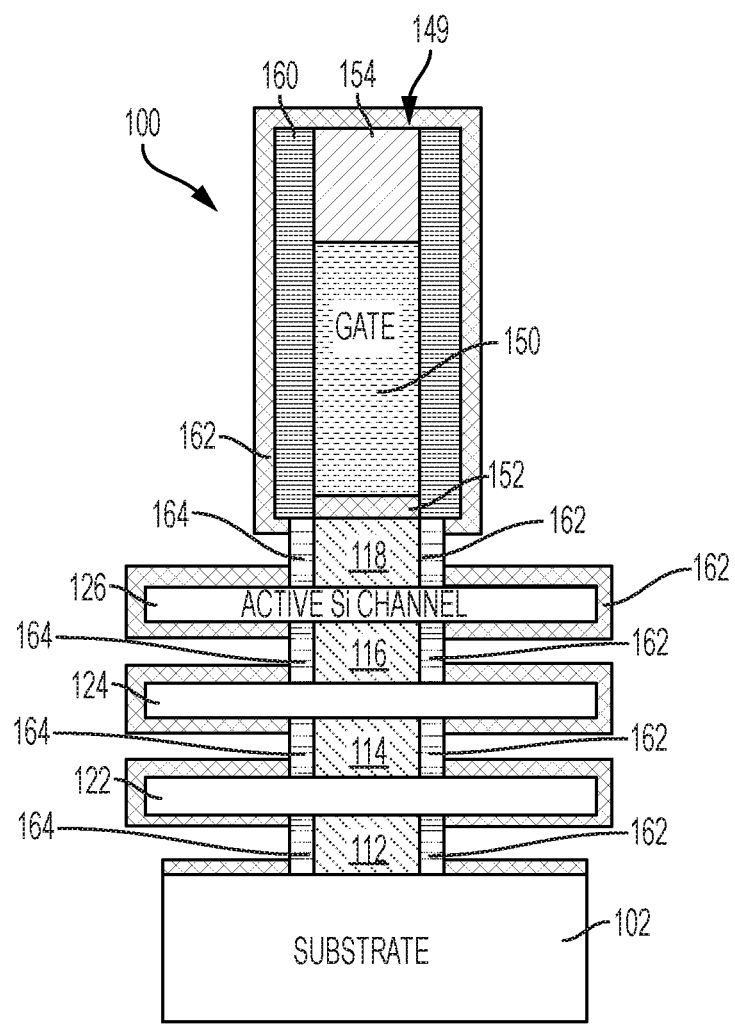

Turning to FIG. 4, the semiconductor structure 100 is illustrated after a low temperature anneal has been applied to the structure 100. In embodiments of the invention where the sacrificial film 162 is $GeO_2$ and the sacrificial nanosheets 112, 114, 116, 118 are SiGe, the $GeO_2$ sacrificial film 162 selectively reacts with SiGe sacrificial nanosheets 112, 114, 116, 118 under the influence of the low temperature anneal. In one or more embodiments of the invention, after deposition of the $GeO_2$ layer, a thermal annealing process is performed in, for example, nitrogen ($N_2$), argon (Ar), helium (He), xenon (Xe), and/or hydrogen at a temperature range of, for example, about 450° C. to about 650° C. The thermal annealing process results in the conversion of the $GeO_2$ layer into a layer 164 on the sidewalls of 112, 114, 116 and 118, which comprise SiGe. The converted layers 164 comprise silicon oxide ($SiO_x$), where x is, for example, 2 in the case of silicon dioxide ($SiO_2$), or 1.99 or 2.01. For ease of explanation, the layers 164 can be referred to as $SiO_2$ layers. Notably, the thermal annealing process does not cause the $GeO_2$ layer 162 on the remaining portion of the silicon nanosheet 122, 124, 126 and substrate 102, on the gate spacer 160 and on the hardmask layer 154 (e.g., SiN) to be converted into $SiO_2$.

According to one or more embodiments of the present invention, during the thermal annealing process, the annealing conditions cause the Si in the SiGe portions on the sidewalls of 112, 114, 116 and 118 to bond with the oxygen in the $GeO_2$ layer 162 to form $SiO_2$ layers 164. The Si in the SiGe fin does not bond with the Ge in the $GeO_2$ layer 162. As a result, the Ge from the $GeO_2$ layer 162 is driven into the inner portions of sidewalls of 112, 114, 116 and 118 and the Si from the inner portions of sidewalls of 112, 114, 116 and 118 is driven out of the sidewalls of 112, 114, 116 and 118 to bond with the oxygen, which forms higher Ge % SiGe portions on sidewalls portion of 112, 114, 116 and 118 (not shown in drawings). The resulting Ge concentration in the sidewall SiGe of 112, 114, 116 and 118 after thermal annealing is higher than the Ge concentration in those layers prior to the thermal annealing.

In accordance with embodiments of the present invention, the annealing can be performed at a temperature range of about 450° C.-about 650° C., in an environment including nitrogen, argon, xenon, helium, hydrogen, or any suitable combination of those gases, for a time period 1 millisecond to 30 minutes. The anneal can be done by rapid thermal annealing (RTP), furnace annealing, flash annealing, laser annealing, spike annealing, or any suitable combination of those techniques. In accordance with an embodiment of the present invention, the annealing may be carried out for a variable period of time. In one example, the annealing process is carried out for a time period from about 0.5 seconds to 2 seconds, depending on temperature and germanium concentration in the SiGe layers 112, 114, 116 and 118. The annealing process may be carried out at a single targeted temperature, or at various ramp and soak cycles using various ramp rates and soak times.

Figure 5:
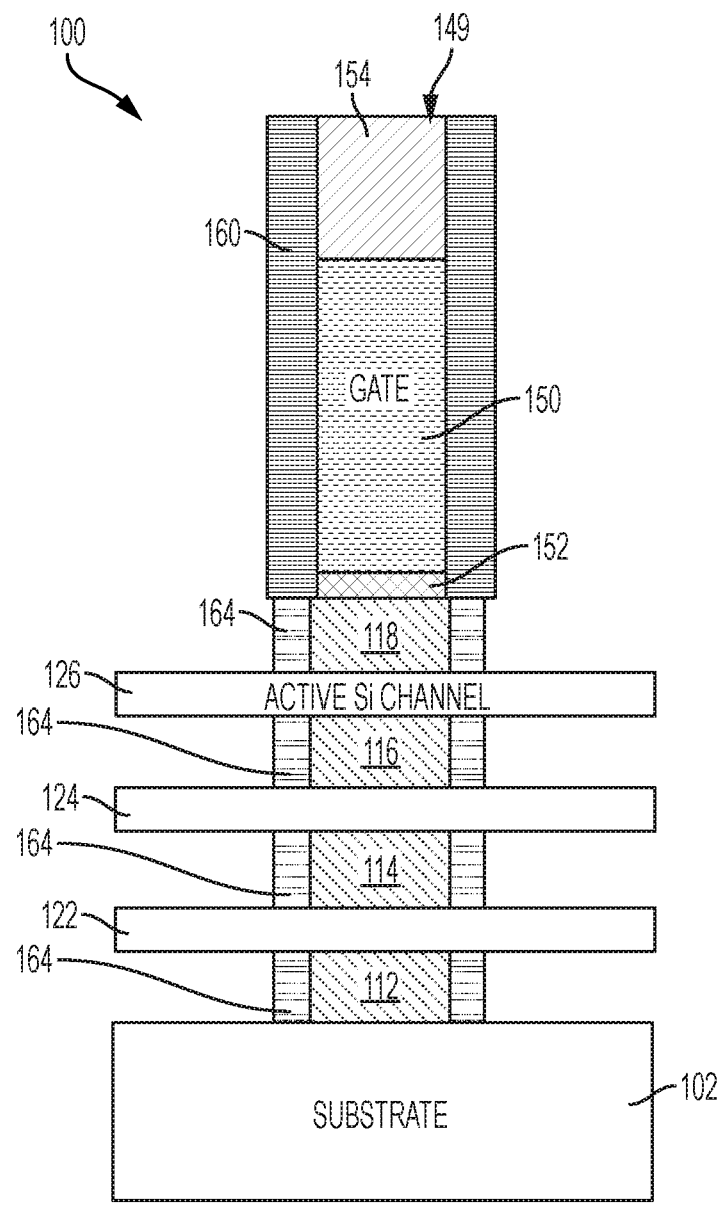

Referring now to FIG. 5, the semiconductor structure 100 is illustrated following removal of the sacrificial film 162. A wet etching process having a chemistry that attacks the material of the sacrificial film 162 (e.g., Ge) can be performed to remove the sacrificial film 162. In this manner, the sacrificial film 162 can be selectively removed from the semiconductor structure 100, while preserving the underlying active nanosheet layers 122, 124, 126, and sidewall portions 164. Accordingly, the sidewall portions 164 are maintained on the sidewalls of the sacrificial nanosheets 112, 114, 116, 118. The remaining sidewalls portions effectively define the inner spacers 164 of a nanowire device fabricated from the process flow described herein. In one or more embodiments at least one set of inner spacers 164 is interposed between the gate spacers 160 and the upper-most active nanosheet layer 126.

Figure 6:
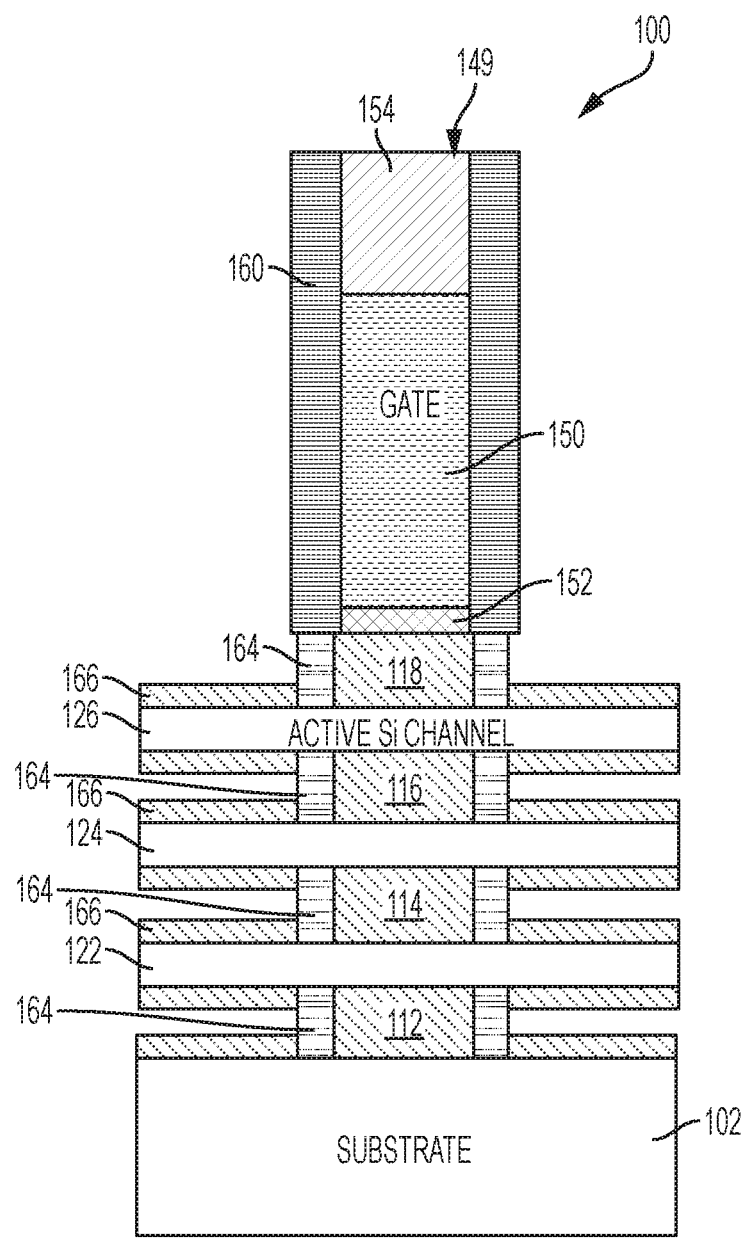

Turning to FIG. 6, the semiconductor structure 100 is illustrated after forming a first cladding layer 166 on the S/D regions of the active nanosheet layers 122, 124, 126. In one or more embodiments, an epitaxy process is performed to epitaxial grow the first cladding layer 166 from exposed surfaces of the active nanosheet layers 122, 124, 126. Accordingly, the first cladding layer 166 can be formed on the entire circumference of the S/D regions of the active nanosheet layers 122, 124, 126. The first cladding layer 166 can have a thickness ranging, for example, from approximately 3 nm to approximately 6 nm.

In one or more embodiments of the invention, the first cladding layer 166 can be formed, for example, from SiGe. The first cladding layer 166 can also be doped and subsequently be utilized as source/drain (S/D) regions of a nanowire device fabricated from the process flow described herein. When forming the first cladding layer 166 from SiGe, the concentration of Ge can range, for example, from about 25% to about 60%.

Figure 7B:
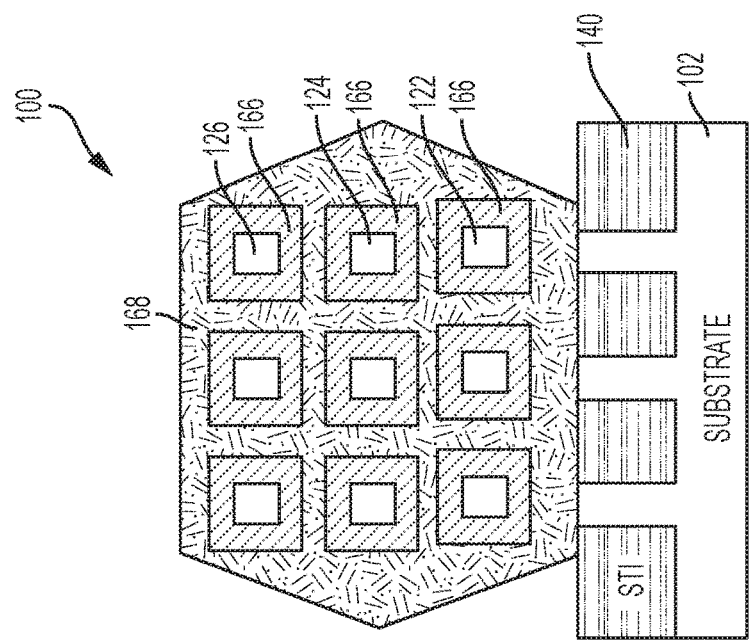
FIG. 7B depicts a cross-sectional view of the semiconductor structure shown in FIG. 7A, wherein the cross-sectional view is taken through a vertical plane extending through a S/D region of the semiconductor structure shown in FIG. 7A and rotated counterclockwise by 90 degrees.
Figure 7A:
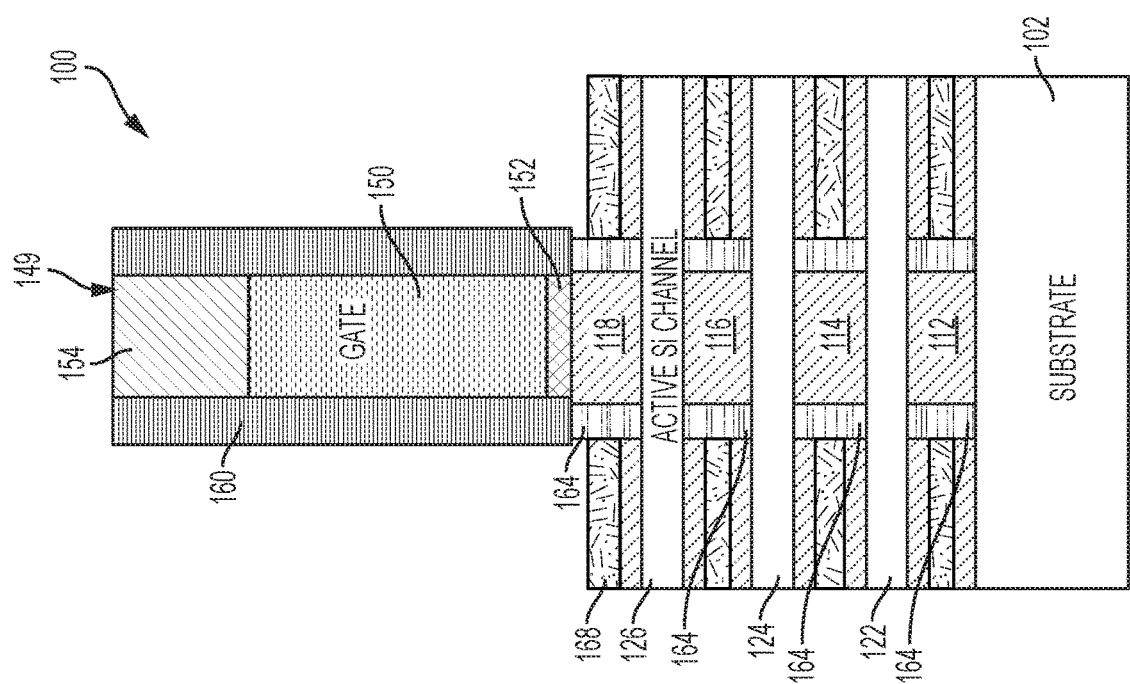
FIG. 7A depicts a cross-sectional view of a semiconductor structure after a fabrication stage according to embodiments of the present invention.

Referring to FIGS. 7A and 7B, the semiconductor structure 100 is illustrated after forming a second cladding layer 168 on the first cladding layer 166. The second cladding layer 168 can be formed using an epitaxy process similar to the process used to form the first cladding layer 166. Accordingly, the second cladding layer 168 can be formed on the exposed surfaces of the first cladding layer 116 and merged as best shown in FIG. 7B. The dimensions and profile of the second cladding layer 168 can serve to define the profile of the S/D contacts (not shown in FIGS. 7A and 7B) which are formed at a subsequent stage of the process flow described in greater detail below.

In one or more embodiments of the invention, the first cladding layer 166 can be formed, for example, from SiGe. The first cladding layer 166 can also be doped and subsequently utilized as source/drain (S/D) regions of a completed nanowire device fabricated from the process flow described herein. When forming the first cladding layer 166 from SiGe, the concentration of Ge can range, for example, from about 25% to about 60%.

Figure 8:
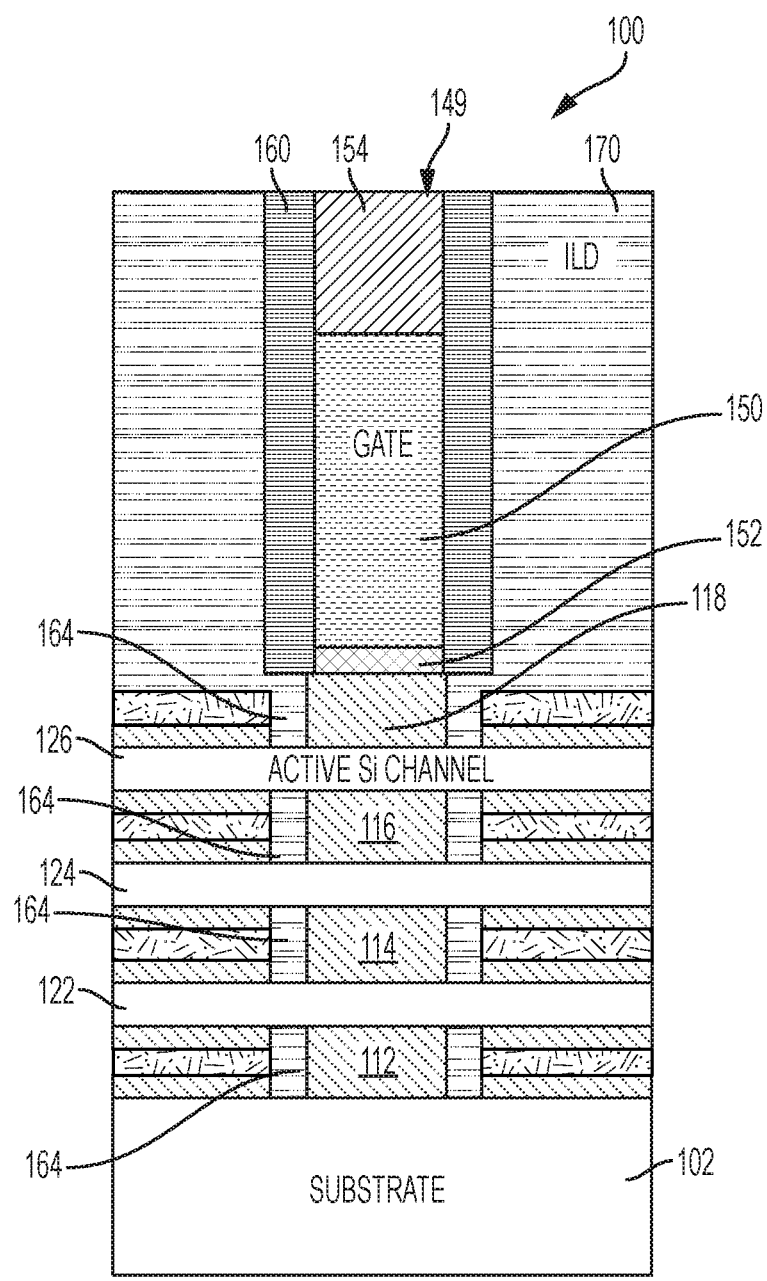

Turning now to FIG. 8, an interlayer dielectric (ILD) 170 is deposited on the semiconductor structure 100. The ILD 170 can be formed from various oxide materials such as, for example, $SiO_2$. In one or more embodiments of the invention, the ILD 170 can be deposited over the entire semiconductor structure 100 using various deposition process such as, for example, chemical vapor deposition (CVD), plasma enhanced chemical vapor deposition, atomic layer deposition, flowable CVD, spin-on dielectrics, or physical vapor deposition. A subsequent chemical-mechanical planarization (CMP) process can be performed to remove an access ILD material from the upper surface of the gate structure 149. In this manner, the upper surface of the ILD 170 can be formed flush (i.e., co-planar) with respect to the upper surface of the gate structure 149.

In one or more embodiments, the second cladding layer 168 has a higher concentration of selected dopants compared to the first cladding layer 166. When the first and second cladding layers 166 and 168 are formed from SiGe, for example, the second cladding layer 168 has a higher concentration of Ge (e.g., about 60% to about 100%) compared to the first cladding layer 166. In this manner, the second cladding layer 168 can be utilized as a sacrificial layer which can be selectively removed while maintaining the underlying first cladding layer 166 as described in greater detail below.

Figure 9:
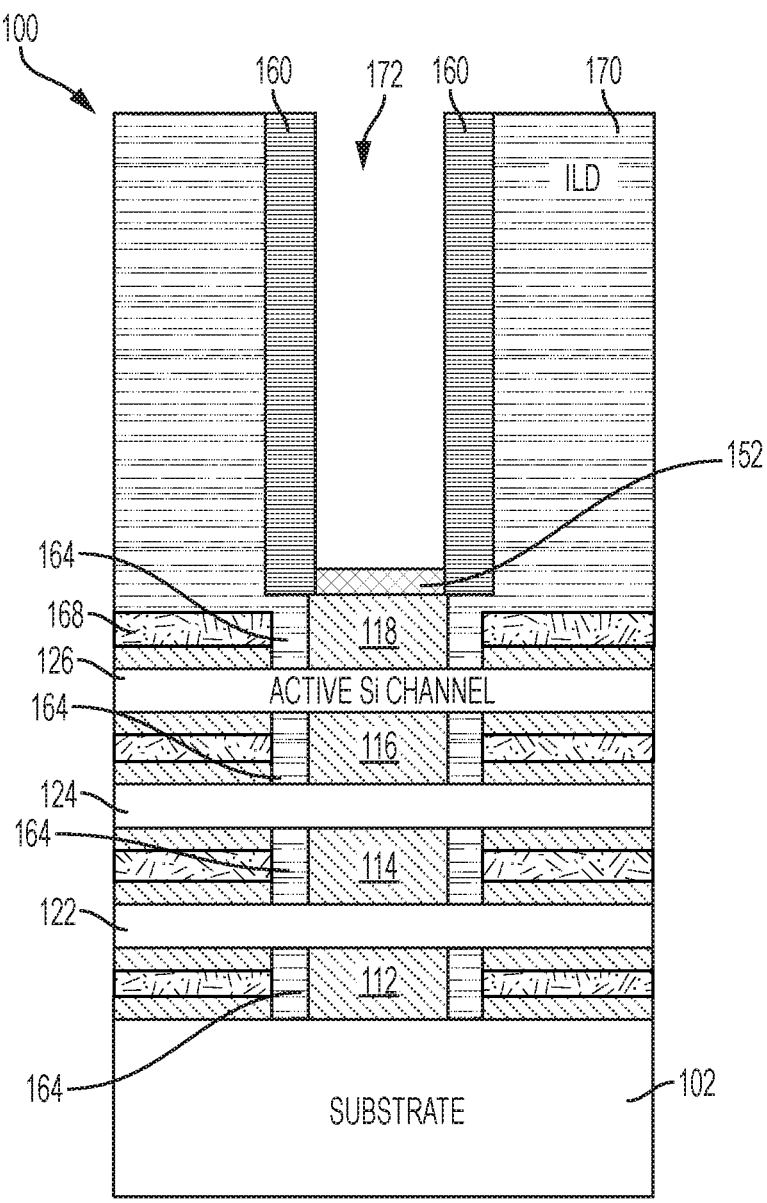

At FIG. 9, the semiconductor structure 100 is illustrated after removing the gate cap 154 and underlying dummy gate 150. Accordingly, a void 172 is formed between the gate spacers 160. The void 172 exposes the gate oxide 152, and allows removal as described below.

Figure 10:
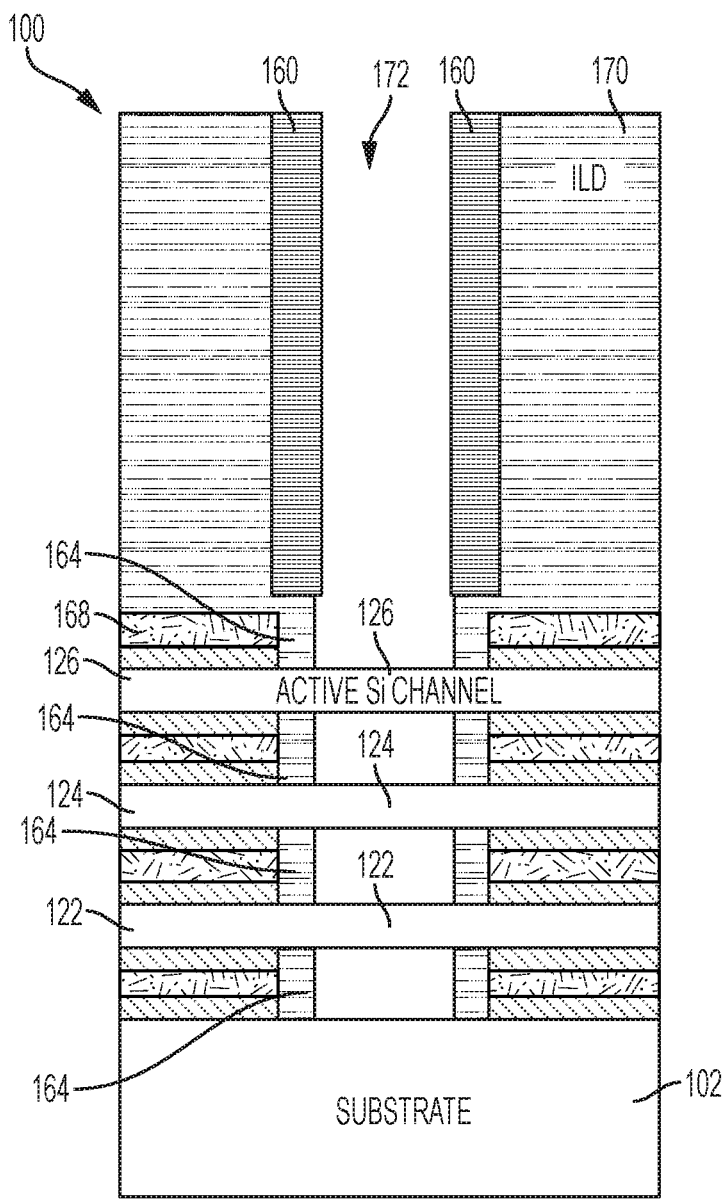

Referring to FIG. 10, the semiconductor structure 100 is illustrated following removal of the gate oxide 152, along with a portions of the nanosheet layers 112, 114, 116, 118 surrounding the channel region of the active nanosheet layers 122, 124, 126. In one or more embodiments of the invention, the gate oxide 152 can be removed by a wet etch process, such as aqueous solution containing a diluted hydrofluoric (HF) acid. The nanosheet layers 112, 114, 116, 118 can be selectively removed by a gas phase hydrogen chloride (HCl) etch. Accordingly, the entire circumference of the nanosheet channel regions 122, 124, 126 located in void 172 can be accessed.

Figure 11:
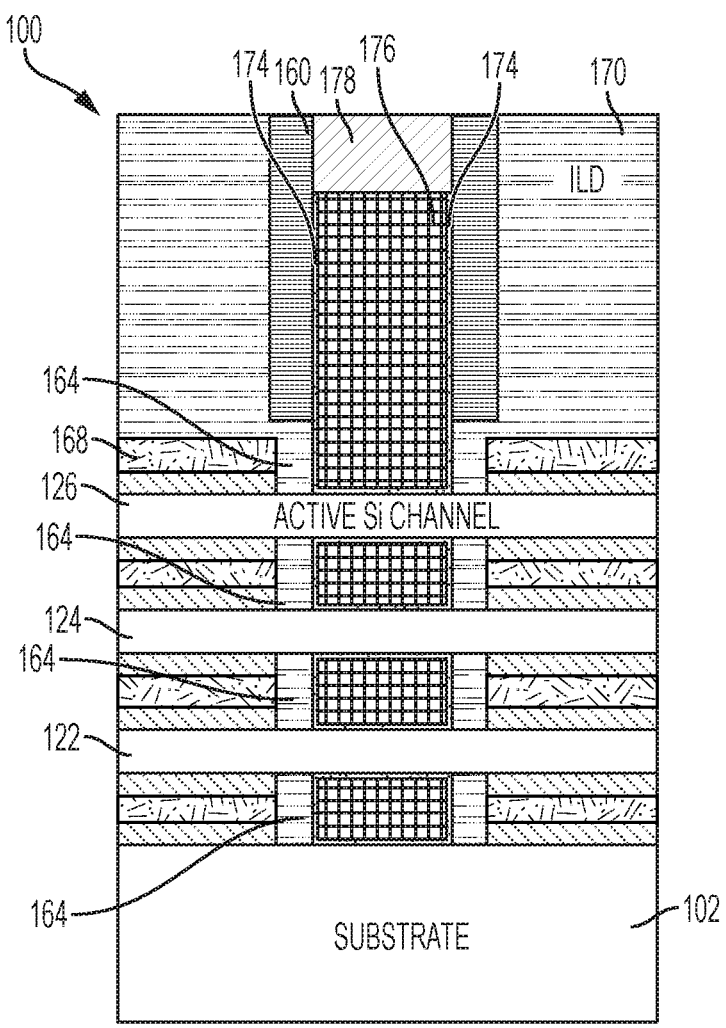

Turning to FIG. 11, the semiconductor structure 100 is illustrated after forming an electrically conductive gate stack in the previously formed void 172. The conductive gate stack includes a gate dielectric layer 174, an electrically conductive gate contact 176 and a gate cap 178.

The gate dielectric layer 174 can be formed by depositing a high-dielectric constant (high-k) material such as hafnium oxide ($HfO_2$), for example, which conforms to the profile of the void 172 and the nanosheet channel regions 122, 124, 126. As shown in FIG. 11, the gate dielectric layer 174 completely encapsulates the entire circumference of the nanosheet channel regions 122, 124, 126. The gate dielectric layer 174 can be deposited by chemical vapor deposition (CVD), atomic layer deposition (ALD), or any other suitable technique. In some embodiments, the gate dielectric comprises a high-k material. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k may further include dopants such as lanthanum, aluminum, magnesium. In some embodiment, the gate dielectric may further comprise silicon oxide, silicon nitride, silicon oxynitride, or any suitable combination of those materials with high-k dielectric material. Gate dielectric can be deposited by chemical vapor deposition (CVD), atomic layer deposition (ALD), or any other suitable technique. The gate dielectric may have a uniform thickness in the non-limiting range of 0.7 nm to 3 nm. The high-k dielectric layer can have a thickness in the non-limiting range of about 0.7 nm to about 3 nm.

The conductive gate contact 176 can be formed by depositing an electrically conductive material into the void 172. The conductive gate contact may be formed of any suitable conducting material, including but not limited to, doped polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material may further comprise dopants that are incorporated during or after deposition. In some embodiments, the gate conductor includes a work function metal layer (not shown) to set the threshold voltage of the transistor to a desired value. The work-functional metal (WFM) includes but not necessarily limited to, for a p-type FET (pFET), titanium nitride (TiN), tantalum nitride (TaN) or ruthenium (Ru), and for an n-type FET (nFET), TiN, titanium aluminum nitride (TiAlN), titanium aluminum carbon nitride (TiAlCN), titanium aluminum carbide (TiAlC), tantalum aluminum carbide (TaAlC), tantalum aluminum carbon nitride (TaAlCN) or lanthanum (La) doped TiN, TaN. The conductive material can be subsequently performing a chemical-mechanical planarization (CMP) process to recess excess material from the upper surface of the ILD 170 and gate spacers 160. Accordingly, the conductive contact 176 surrounds the entire circumference of the S/D regions of the active nanosheet layers 122, 124, 126. In one or more embodiments, the conductive contact 176 can be partially recessed to form a cavity (not shown) which is then backfilled with a nitride material such as silicon nitride (SiN), for example, to form the gate cap 178.

Figure 12:
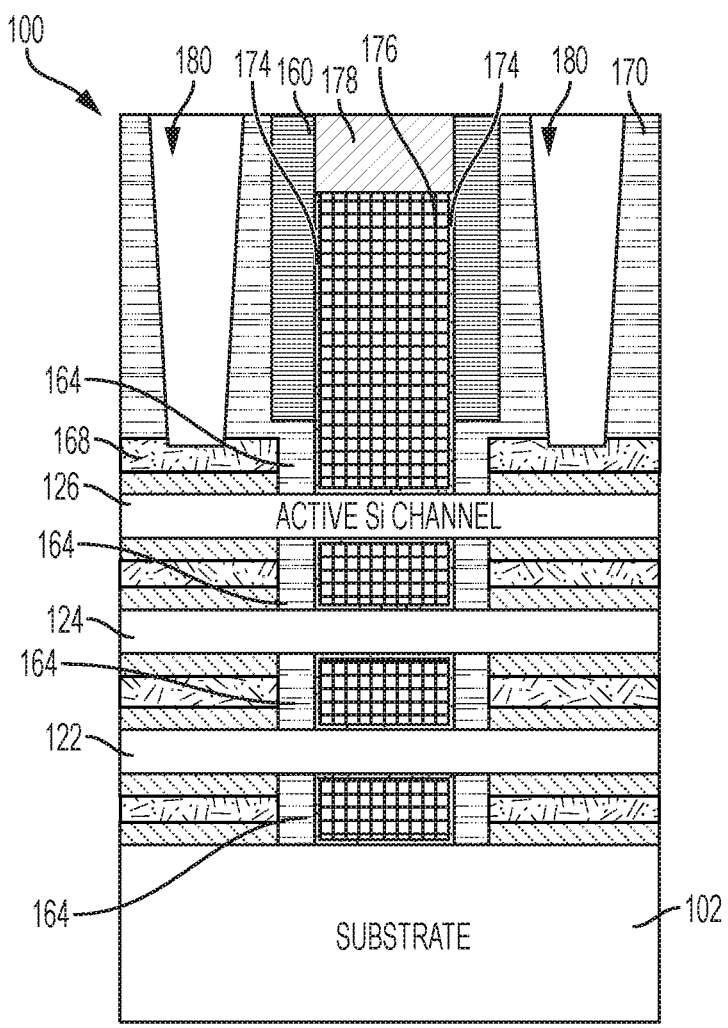

Referring now to FIG. 12, the semiconductor structure 100 is illustrated after forming contact trenches 180 in the ILD 170. In one or more embodiments, the ILD 170 is patterned using various photolithography and patterning processes understood by those of ordinary skill in the art to form the contact trenches 180. Accordingly, the second cladding layer 168 is exposed.

Figure 13:
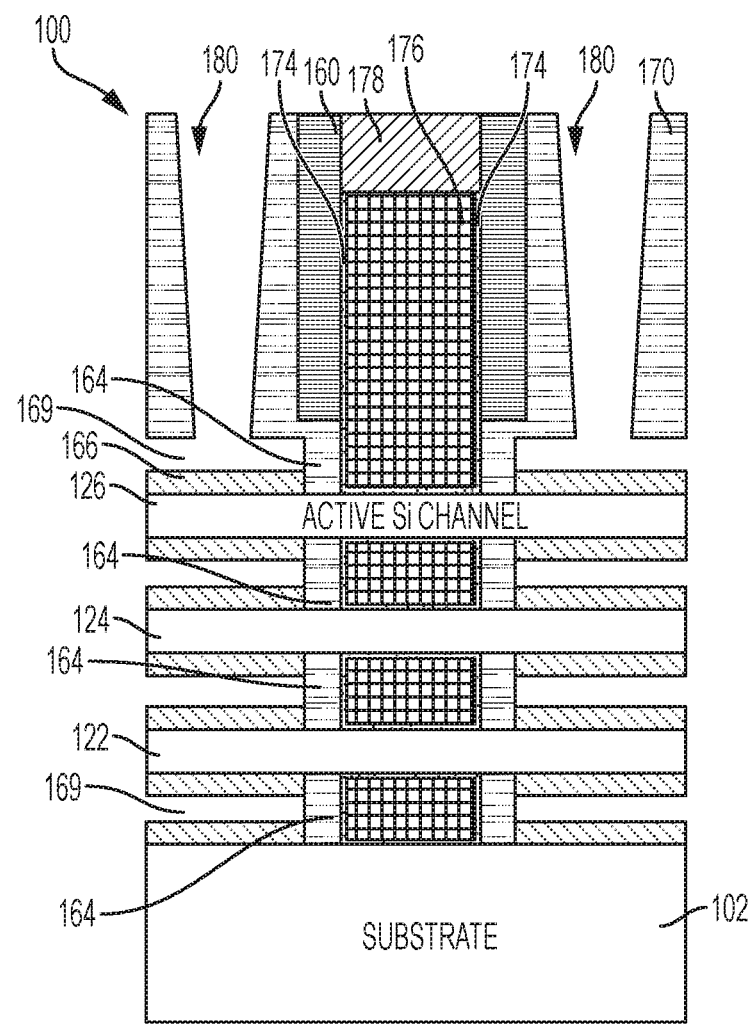

At FIG. 13, the semiconductor structure 100 is illustrated after stripping away the second cladding layer 168 from the first cladding layer 166. Accordingly, voids 169 are formed between the remaining first cladding layers 166 and also beneath portions of the ILD 170. In this manner, the S/D regions of the active nanosheet layers 122, 124, 126 are released and the outer surfaces of the first cladding layer 168 are exposed by the contact trenches 180.

In one or more embodiments, the removal of the second cladding layer 168 (high Ge containing) from the first cladding layer 166 can be achieved by a wet etch. In some embodiments of the invention, the wet etch is timed etch. The wet etch can include using a mixture of ammonia and hydrogen peroxide in some embodiments of the invention. In some embodiments of the invention, with the understanding that etch rates increase as Ge content increases, the amount of material that is etched away increases as the amount of Ge in a particular layer increases. Alternatively, in some embodiments of the invention, the removal of the second cladding layer 168 can be achieved by a vapor etch. The vapor etch can also include gas phase hydrogen chloride (HCl).

Figure 14B:
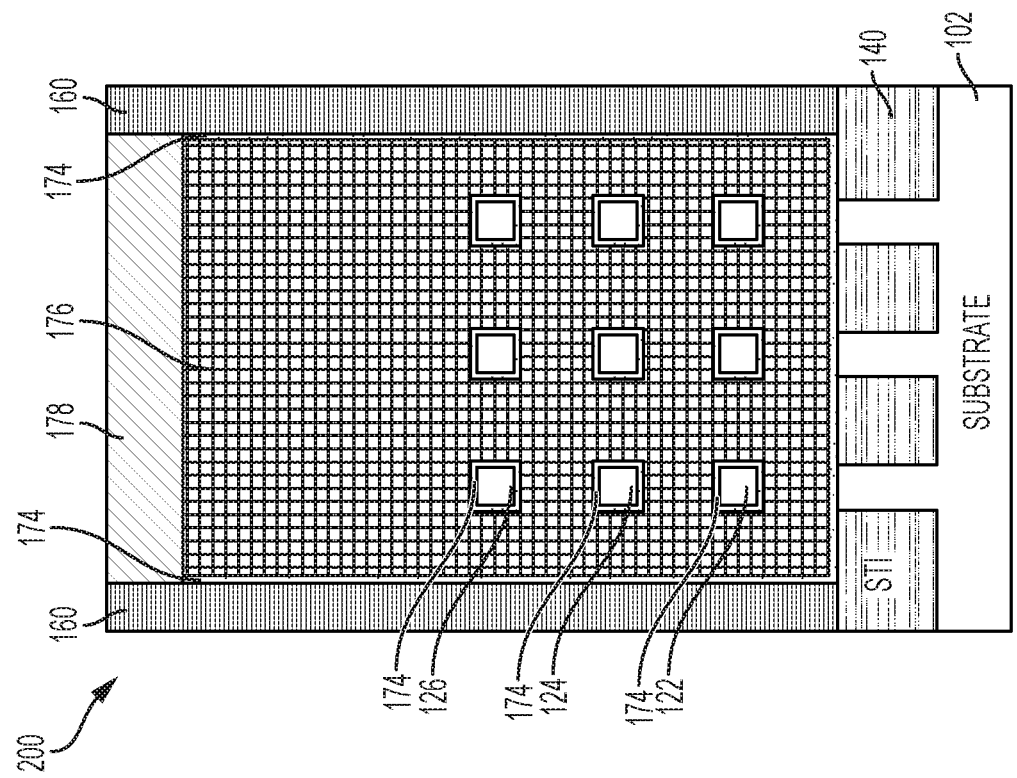
FIG. 14B depicts a cross-sectional view of the semiconductor structure shown in FIG. 14A, wherein the cross-sectional view is taken through a vertical plane extending through the gate structure region shown in FIG. 14A and rotated clockwise by 90 degrees.
Figure 14A:
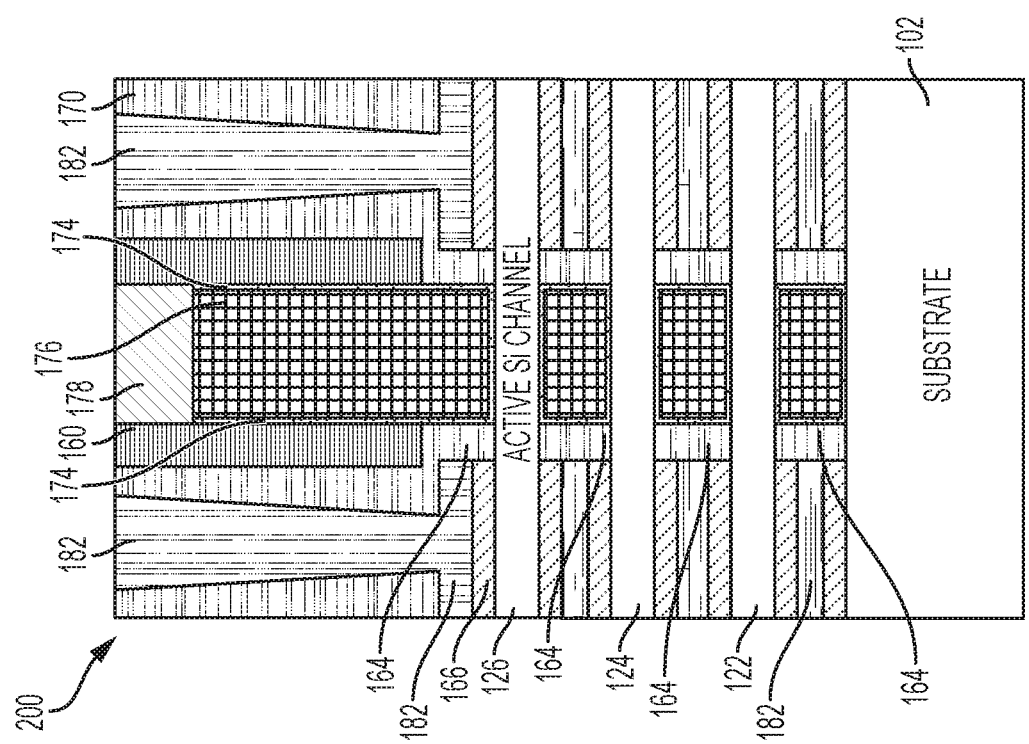
FIG. 14A depicts a cross-sectional view of a semiconductor structure after a fabrication stage according to embodiments of the present invention.
Figure 14C:
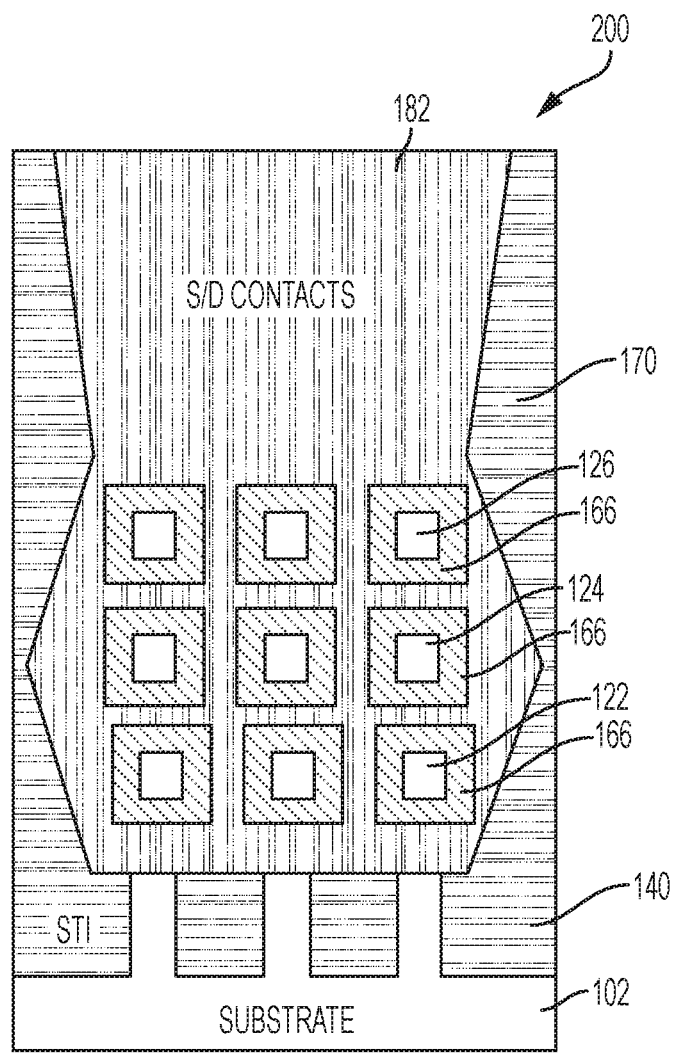

Turning to FIGS. 14A, 14B and 14C, a completed nanosheet transistor 200 is illustrated after forming S/D contacts 182 that completely surround the circumference of the S/D regions of the active nanosheet layers 122, 124, 126. The S/D contacts 182 can be formed by depositing an electrically conductive contact material 182 in the contact trenches 180. The contact material 182 can be deposited using an ALD process, for example, and can include various metal materials including, but not limited to, tungsten (W) or cobalt (Co). Although not illustrated, a contact liner formed of titanium/titanium nitride (Ti/TiN), for example, can be deposited in the contact trench prior to depositing the contact material. A CMP process can be subsequently performed to remove any excess contact material from the upper surface of the semiconductor structure 100, thereby forming the S/D contacts 182. Not only does the gate contact 176 completely surround the entire circumference of the channel regions of the active nano sheet layers 122, 124, 126 as best shown in FIG. 14B, but the S/D contacts 182 completely surround the entire circumference of the S/D regions of the active nanosheet layers 122, 124, 126 as best shown in FIG. 14C. In this manner, resistances at the channel region and S/D contact regions are reduced, thereby improving the overall nanosheet transistor 200.

As described herein, various non-limiting embodiments of the invention provide fabrication methods and resulting structures for forming nanowire FETs having reduced external resistance by forming wrap-around contact and growing high-quality S/D epitaxy by utilizing the entire nanowire circumference. In at least one example, sacrificial SiGe layers in the source/drain region are selectively removed while preserving the underlying Si nanowires before forming inner spacers. After forming the inner spacers, the entire Si nanowire circumference is utilized to grow a high-quality cladding epitaxy around Si nanowires. Metal contacts can then be formed, which wrap around the entire surface of the cladding epitaxy thereby reducing resistance and improving overall device performance.

The methods described herein are used in the fabrication of IC chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the detailed description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection," and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of fabricating a semiconductor device, the method comprising:
    forming a stack of alternating layers of sacrificial nanosheets and semiconductor nanosheets on a semiconductor substrate;
    forming a gate structure on the stack to define a channel region of the semiconductor nanosheets, the channel region interpose between opposing source or drain (S/D) regions;
    depositing a sacrificial layer comprising a first dielectric material on the S/D regions of the semiconductor nanosheets and sidewalls of the sacrificial nanosheets; and
    converting a portion of the sacrificial layer into a second dielectric material different form the first dielectric material to form inner spacers of the semiconductor device.

2. The method of claim 1, further comprising partially etching the sacrificial nanosheets while preserving the semiconductor nanosheets to form the S/D regions of the semiconductor nanosheets and the sidewalls of the sacrificial nanosheets.

3. The method of claim 2 further comprising:
    forming at least one cladding layer on the S/D regions; and
    forming electrically conductive S/D contacts on the cladding layer.

4. The method of claim 3, wherein the S/D contacts wrap around an entire circumference of the S/D regions of each semiconductor nanosheet.

5. The method of claim 4, wherein forming the S/D contacts comprises:
    forming a first cladding layer comprising a first semiconductor material on an outer surface of the S/D regions;
    forming a second cladding layer comprising a second semiconductor material on the first cladding layer to define a S/D contact profile;
    removing the second cladding layer while preserving the first cladding layer to form S/D contact trenches; and
    filling the S/D contact trenches with an electrically conductive contact material to form the S/D contacts having the S/D contact profile.

6. The method of claim 5, wherein the first semiconductor material has a first amount of selected dopants and the second semiconductor material has a different amount of the selected dopants.

7. The method of claim 6, wherein the first semiconductor material is silicon germanium (SiGe) comprising a first amount of germanium (Ge), and the second semiconductor material is SiGe comprising a second amount of Ge greater than the first amount of Ge.

* * * * *